United States Patent [19]

Shibuya et al.

[11] Patent Number: 5,766,342
[45] Date of Patent: Jun. 16, 1998

[54] METHOD FOR FORMING SILICON FILM AND SILICON FILM FORMING APPARATUS

[75] Inventors: Munehiro Shibuya, Kyoto; Masatoshi Kitagawa, Hirakata; Yuji Mukai, Kadoma; Takashi Hirao, Moriguchi; Akihisa Yoshida, Kyoto, all of Japan

[73] Assignee: Matsushita Electric Industrial Co., Ltd., Kadoma, Japan

[21] Appl. No.: 544,016

[22] Filed: Oct. 17, 1995

[30] Foreign Application Priority Data

Oct. 19, 1994 [JP] Japan .................. 6-253398

[51] Int. Cl.$^6$ .................. C30B 23/06
[52] U.S. Cl. .................. 117/54; 117/68; 117/88; 117/206; 117/931
[58] Field of Search .................. 117/931, 88, 54, 117/68, 206

[56] References Cited

U.S. PATENT DOCUMENTS

| | | | |
|---|---|---|---|
| 4,479,847 | 10/1984 | McCaldin et al. | 117/931 |
| 4,624,859 | 11/1986 | Akira et al. | 427/38 |
| 4,894,352 | 1/1990 | Lane et al. | 437/238 |

FOREIGN PATENT DOCUMENTS

| | | |
|---|---|---|
| 2166725 | 6/1990 | Japan . |
| 2310916 | 12/1990 | Japan . |
| 4120731 | 4/1992 | Japan . |

OTHER PUBLICATIONS

Frieser, "Low Temperature Silicon Epitaxy," Research & Development Labs., pp. 401–405, vol. 115, No. 4, J. Electrochem. Soc. : Solid State Science.

Kylkov, "Diataxial Growth of Siliocn and Germanium", Journal of Crystal Growth, vol. 52 pp. 687–691, 1981.

*Primary Examiner*—Robert Kunemund
*Attorney, Agent, or Firm*—Renner, Otto, Boisselle & Sklar

[57] ABSTRACT

The method for forming a silicon film of this invention includes the steps of introducing a compound containing silicon and chlorine and being in a liquid form under normal pressure and at an ordinary temperature into a reaction chamber, and spraying the compound in the liquid form in a fine particle state to a surface of a substrate supported in the reaction chamber, and decomposing the compound in the fine particle state by energy applied from outside of the reaction chamber, and depositing a silicon film on the substrate supported in the reaction chamber.

23 Claims, 6 Drawing Sheets

METHOD FOR FORMING SILICON FILM AND SILICON FILM FORMING APPARATUS

BACKGROUND OF THE INVENTION

1. Field of the Invention

The present invention relates to a method for forming a thin film and a thin film forming apparatus. More specifically, the present invention relates to a method for forming a silicon film and a silicon film forming apparatus.

2. Description of the Related Art

Various kinds of thin films used for semiconductor devices are formed by physical deposition methods such as sputtering and vacuum deposition, or a CVD (chemical vapor deposition) method. Particularly, attention is directed to the CVD method as an effective method for forming a thin film, and a silicon film is mainly formed by the CVD method.

FIG. 7 schematically shows a cross-section of a conventional apparatus for forming a silicon film. A conventional silicon film forming apparatus 200 includes a vacuum chamber 202, a gas supplying port 204 and an exhaust port 206 connected to the vacuum chamber 202, and a heater 208 disposed around the vacuum chamber 202. The vacuum chamber 202 is evacuated by an exhaust pump connected to the exhaust port 206 so as to produce a vacuum therein. From the gas supplying port 204, monosilane gas ($SiH_4$) and hydrogen are introduced into the vacuum chamber 202 with a flow rate controlled by a mass flow controller. The monosilane gas introduced into the vacuum chamber 202 is heated by the heater 208 which controls the temperature in the vacuum chamber 202, and the monosilane gas is thermally decomposed. Consequently, a silicon film is deposited on a substrate 210 supported in the vacuum chamber 202.

In the conventional method for forming a silicon film by using the apparatus 200, only a part of the monosilane gas introduced into the vacuum chamber 202 is thermally decomposed so as to contribute to the formation of the silicon film. The remaining monosilane gas which has not been decomposed is exhausted from the exhaust port 206. Accordingly, a major part of the monosilane gas introduced into the conventional apparatus 200 is wastefully exhausted. As a result, the utilization efficiency of monosilane gas is poor.

Monosilane gas of high purity is expensive. Therefore, if the utilization efficiency thereof is poor, the cost for forming a silicon film disadvantageously increases. For example, if a solar cell is produced by using the silicon film formed by this method, then the cost for producing the solar cell becomes adversely higher with respect to the electric power which the solar cell can generate during its life. Therefore, such a solar cell can not be practically used.

Moreover, it is possible that monosilane gas may explode or ignite in the air. Therefore, in the case of using monosilane gas, safety equipment is required, which results in further increases in the production costs.

Preferably, the pressure of monosilane gas when forming a silicon film is set to be low, in view of safety considerations. However, if the pressure of monosilane gas is low, the deposition rate of the silicon films becomes low, which results in low productivity. On the other hand, if monosilane gas is treated under high pressure in order to increase productivity while addressing relevant safety considerations, the cost required for safety equipment is adversely increased.

SUMMARY OF THE INVENTION

In one embodiment, the method for forming a silicon film of this invention includes the steps of introducing a compound containing silicon and chlorine and being in a liquid form under normal pressure and at an ordinary temperature into a reaction chamber, and spraying the compound in the liquid form in a fine particle state to a surface of a substrate supported in the reaction chamber, and decomposing the compound in the fine particle state by an energy applied from outside the reaction chamber, and depositing a silicon film on the substrate supported in the reaction chamber.

In one embodiment of the invention, the step of spraying the compound includes a step of spraying the compound through a nozzle connected to the reaction chamber by using at least one of a carrier gas and a reaction gas.

In another embodiment of the invention, the step of spraying the compound includes a step of vibrating the liquid compound supported so as to face to the substrate using ultrasonic waves, and spraying the compound from the surface of the liquid onto the substrate.

In still another embodiment of the invention, an area of the surface of the liquid is larger than an area of the surface of the substrate.

In still another embodiment of the invention, the step of spraying the compound includes a step of supplying the compound in the fine particle state to the substrate by introducing at least one of a carrier gas and a reaction gas.

In still another embodiment of the invention, the step of depositing the silicon film is conducted under a pressure in a range of several tens of Torr to about 1 atmosphere of pressure.

In still another embodiment of the invention, the substrate is heated by the energy, and the compound in the fine particle state is thermally decomposed by energy radiation from the substrate.

In still another embodiment of the invention, the compound in the fine particle state in the reaction chamber is decomposed into plasma by the energy.

In still another embodiment of the invention, the compound is hexachlorodisilane ($Si_2C_6$) or tetrachlorosilane ($SiCl_4$).

In still another embodiment of the invention, the compound is dichlorosilane ($SiH_2Cl_2$) or trichlorosilane ($SiHCl_3$).

In still another embodiment of the invention, the compound is liquefied by pressurization or cooling.

In still another embodiment of the invention, the reaction gas is hydrogen or carbon monoxide.

In still another embodiment of the invention, the carrier gas is argon or helium.

According to another aspect of the invention, a silicon film forming apparatus includes: a reaction chamber having a space; a device for introducing a compound containing silicon and chlorine and being in a liquid form under a normal pressure and at an ordinary temperature into the reaction chamber, and spraying the compound in a liquid form in a fine particle state onto a surface of a substrate supported in the reaction chamber; and a device for decomposing the compound in the fine particle state.

In one embodiment of the invention, the spraying device includes a liquid sprayer having a liquid introducing port, a gas introducing port, and a nozzle connected to the reaction chamber, and the compound introduced from the liquid introducing port is sprayed from the nozzle to the reaction chamber by using at least one of a carrier gas and a reaction gas introduced from the gas introducing port.

In another embodiment of the invention, the spraying device is connected to the reaction chamber, and includes: a port facing the surface of the substrate; a material vessel for storing the compound; and an ultrasonic generator for supplying ultrasonic energy to the material vessel.

In still another embodiment of the invention, an area of the port of the material vessel is larger than that of the surface of the substrate.

In still another embodiment of the invention, a silicon film forming apparatus further includes a gas introducing port for introducing at least one of the carrier gas and the reaction gas from a periphery of the port of the material vessel into the reaction chamber.

In still another embodiment of the invention, the decomposition device includes a heating device for heating the substrate, and decomposing the compound in the fine particle state in a vicinity of the surface of the substrate by heating the substrate.

In still another embodiment of the invention, the heating device includes a substrate holder for supporting the substrate, and a heater provided for the substrate holder.

In still another embodiment of the invention, the decomposition device includes a ratio frequency power applicator provided around the reaction chamber, and decomposes the compound in the fine particle state in the reaction chamber into plasma by the ratio frequency power applicator.

Thus, the invention described herein makes possible the advantages of providing a method for forming a silicon film at low cost and a apparatus for forming a silicon film.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
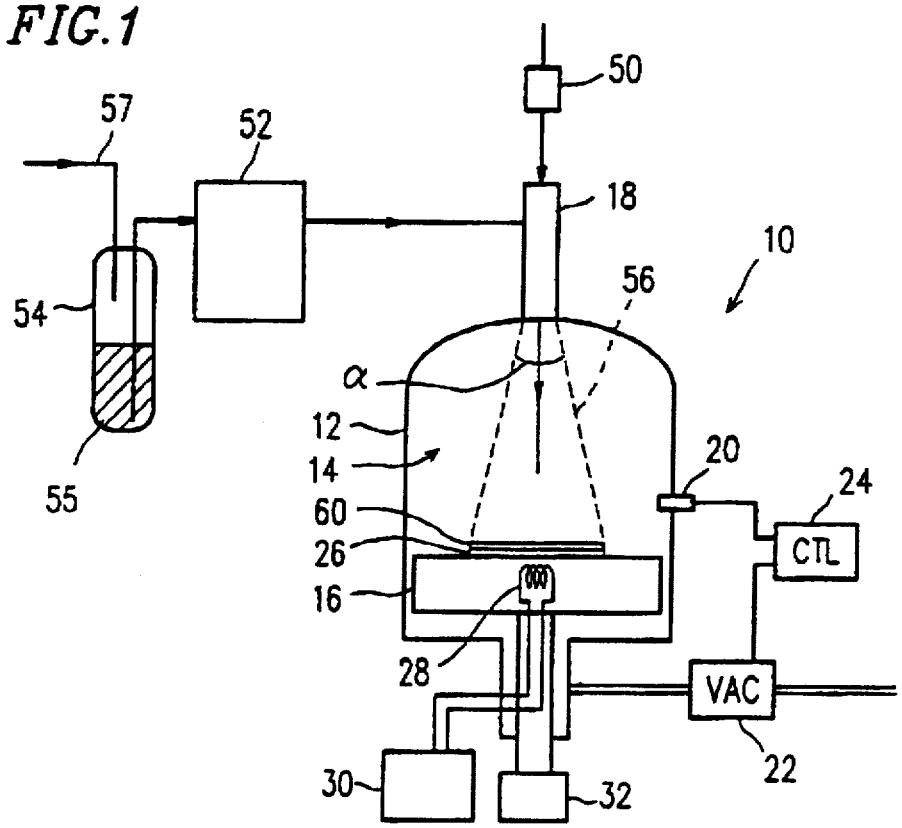
FIG. 1 is a view schematically showing a structure for a silicon film forming apparatus according to a first example of the invention.

FIG. 1 is a view schematically showing a structure for a silicon film forming apparatus of Example 1 according to the present invention. A silicon film forming apparatus 10 includes: a reaction chamber 12; a substrate holder 16 provided in a space 14 formed by the reaction chamber 12; and a sprayer 18 connected to the reaction chamber 12.

The reaction chamber 12 is provided with a pressure gauge 20 so as to detect the pressure in the space 14. Based on the value detected by the pressure gauge 20, a vacuum controller 24 controls an exhaust pump 22 connected to the reaction chamber 12 so that the space 14 is maintained at a constant pressure. Preferably, the gas exhausted from the exhaust pump 22 is connected to a discharging tank (not shown), etc.

Preferably, the reaction chamber 12 is made of a material such as quartz or stainless steel, which is not corroded by a material gas, as described below. The reaction chamber 12 can have any size in accordance with the size of the silicon film to be formed therein. In this example, the reaction chamber 12 used is made of quartz with a diameter of approximately 180 mm.

The substrate holder 16 is provided with a heater 28 for heating a substrate 26 supported on the surface of the substrate holder 16. The temperature of the substrate 26 is controlled by a temperature controller 30 connected to the heater 28. The substrate holder 16 can be provided with a rotation controller 32 for rotating the substrate 26, in order to increase the uniformity of the silicon film to be formed thereon.

Figure 2:
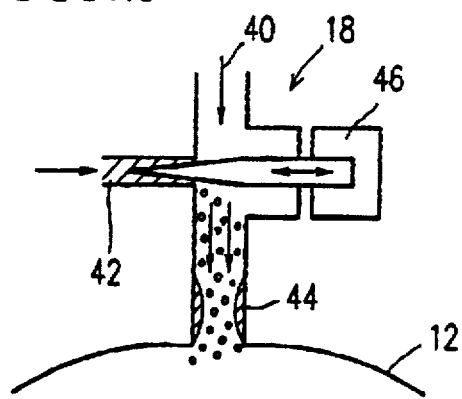
FIG. 2 is a cross-sectional view schematically showing a structure for a sprayer of the silicon film forming apparatus shown in FIG. 1.

As shown in FIG. 2, the sprayer 18 includes: a gas introducing port 40; a liquid introducing port 42; and a nozzle 44 connected to the reaction chamber 12. From the liquid introducing port 42, a liquid material containing silicon and chlorine is introduced. The flow rate of the liquid material is adjusted by a needle valve 46 provided in the liquid introducing port 42 so that the liquid material introduced from the liquid introducing port 42 is not vaporized in the sprayer 18. From the gas introducing port 40, carrier gas, reaction gas, or mixed gas thereof is supplied.

As shown in FIG. 1, the carrier gas or the reaction gas is introduced into the sprayer 18 via a mass flow controller 50. A liquid material 55 stored in an ample 54 is pressurized by inert gas or the like supplied through a piping 57, so that the liquid material 55 is introduced into the sprayer 18 via a liquid flow rate controller 52. Then, the liquid material 55 supplied through the liquid introducing port 42 is pressurized by a gas introduced through the gas introducing port 40 so that the liquid material 55 is sprayed from the nozzle 44 into the space 14 in the reaction chamber 12 in the state of liquid fine particles. The spread angle a of the nozzle 44 is adequately selected in order that the liquid material 55 is sprayed onto the entire surface of the substrate 26 supported on the substrate holder 16, as described below. Liquid fine particles usually have a size of about 1 μm to about 100 μm, and preferably, about 2 μm to about 50 μm, and more preferably, about 3 μm to about 30 μm. However, the size is not limited to a specific value, and the particles can be of any size so far as the particles are in mist state.

According to the present invention, hexachlorodisilane ($Si_2Cl_6$) may be used as the liquid material for forming a silicon film. Hexachlorodisilane has a boiling point of approximately 145° C., and is in a liquid state under normal pressure and at an ordinary temperature. There is no danger of hexachlorodisilane exploding or igniting by reacting with oxygen or water in the air, unlike monosilane and disilane. Instead, hexachlorodisilane has corrosiveness, and is decomposed when it reacts with water, so as to generate chlorine or hydrogen chloride. Hexachlorodisilane can be purchased from Toagosei Chemical Industry Co., Ltd. Alternatively, instead of hexachlorodisilane, tetrachlorosilane ($SiCl_4$), dichlorosilane ($SiH_2Cl_2$), and trichlorosilane ($SiHCl_3$) can be used as the liquid material.

To efficiently remove chlorine generated by the decomposition of hexachlorodisilane from the reaction system, or to remove oxygen from the reaction system, it is preferable to add a reaction gas. As the reaction gas, it is preferable to use hydrogen or carbon monoxide.

Since the liquid material has corrosiveness, it is preferred that the silicon film forming apparatus 10 is made of an anticorrosive material or parts having an anticorrosive structure. The apparatus and parts used for treating a corrosive gas or liquid are well known in the art. The silicon film forming apparatus according to the present invention can be such an apparatus or an assembly of such parts. In the silicon film forming apparatus 10, it is preferable to use a mass flow controller for hexachlorodisilane as the liquid flow rate controller 52. However, if such a mass flow controller is not available, an anticorrosive liquid mass flow controller can be used. In this example, a thermal liquid mass flow controller F900 manufactured by the Kojima Ltd. is used. Herein, since the conversion factor of hexachlorodisilane is not known, the conversion factor of water is used to control the liquid flow rate.

Hereinafter, a method for forming a silicon film by using the silicon film forming apparatus 10 will be described.

First, the substrate 26 made of quartz or silicon is supported on the substrate holder 16. The reaction chamber 12 is evacuated by using the exhaust pump 22 to produce a vacuum therein. Then, the substrate 26 is heated by the heater 28. In forming the silicon film, it is preferable to maintain the substrate 26 at the temperature in the range of about 450° to about 800° C., and preferably about 550° C to about 750°0 C. More preferably, the substrate 26 is maintained at approximately 700° C.

Next, inert gas such as argon or helium is introduced from the piping 57 into the ample 54 in which hexachlorodisilane is contained as the liquid material 55, so that the ample 54 is pressurized. In this example, the ample 54 is pressurized to approximately 1.5 Kg/cm², so that hexachlorodisilane, which is the liquid material, is supplied to the liquid flow rate controller 52 under a constant pressure. The liquid material 55 is supplied to the sprayer 18 by the liquid flow rate controller 52 at the predetermined flow rate.

In the sprayer 18, the liquid material 55 is adjusted at the adequate flow rate by the needle valve 46 so that the liquid material 55 is not vaporized in the sprayer 18. The carrier gas, the reaction gas, or the mixed gas thereof to which adequate pressure is applied by the mass flow controller 50 is introduced into the sprayer 18. Then, the gas and the liquid material 55 are mixed, and the liquid material 55 is sprayed from the nozzle 44 onto the substrate 26 in the reaction chamber 12. The liquid material 55 sprayed from the nozzle 44 is turned into fine particles, and is dispersed onto the surface of the substrate 26 while spreading in the reaction chamber 12, as shown by a broken line 56. Preferably, the reaction chamber 12 is adjusted at a pressure in the range of several tens of Torr to approximately 1 atmosphere of pressure. A part of the liquid material 55 sprayed from the nozzle 44 can be vaporized. In such a case, as mentioned below, the utilization efficiency of the material possibly becomes a little lower. However, if a part of the liquid material in a fine particle state is sprayed onto the substrate 26, the deposition rate is significantly increased as compared with a conventional method.

The liquid material 55 in the fine particle state reaches the vicinity of the surface of the substrate 26, and receives radiated energy from the heated substrate 26. As a result, the liquid material 55 in the fine particle state is decomposed, so that silicon is deposited on the substrate 26. In this manner, a silicon film 60 is formed on the substrate 26.

The silicon film 60 formed by this method is a polycrystalline silicon film, and the quality thereof is suitable for a semiconductor apparatus such as a solar cell. Table 1 shows the deposition rates of the silicon films formed by the above-mentioned method and those of the silicon films formed by the conventional method, respectively. Table 1 shows the result of the case where hexachlorodisilane is supplied at a flow rate of 1.8 g/hr by using the conversion factor of $H_2O$ and reacted with argon gas used as the carrier gas at the flow rate of 15 l/min.

TABLE 1

| Formation method | Material | Reaction pressure (Torr) | Substrate temperature (°C.) | Deposition rate (nm/min) |
| --- | --- | --- | --- | --- |
| Conventional art | $SiH_4$ | 1 | 700 | 10 |
| Conventional art | $SiH_4$ | 760 | 700 | 1000 |
| Example 1 | $Si_2Cl_6$ | 760 | 700 | 10000 |
| Example 2 | $Si_2Cl_6$ | 760 | 700 | 5000 |

Figure 3:
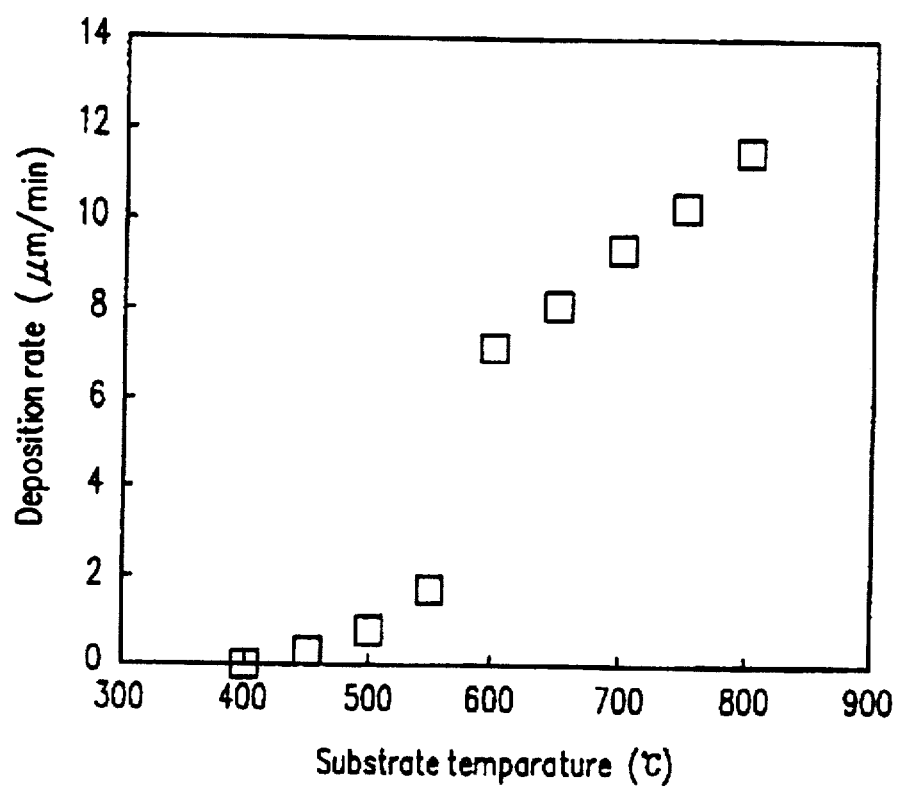
FIG. 3 is a graph showing a relationship between a substrate temperature and a deposition rate of the silicon film formed by using the silicon film forming apparatus shown in FIG. 1.

As shown in Table 1, according to the present invention, the deposition rate is approximately ten times as fast as that obtained by a conventional CVD method using monosilane. FIG. 3 is a graph showing a variation of the deposition rate in accordance with substrate temperature. As shown in FIG. 3, as the substrate temperature becomes higher, the decomposition of hexachlorodisilane is promoted, and the deposition rate is increased.

As is apparent from the foregoing description, according to the method of this example, hexachlorodisilane used as a material for the silicon film, is sprayed in a state of liquid fine particles only onto the substrate 26 in the reaction chamber 12. The material is provided only onto the substrate, thereby reducing an amount of the material which does not contribute to the formation of the silicon film and is wastefully exhausted. As a result, the utilization efficiency of the material becomes significantly high. Even in the case where a part of the material sprayed from the nozzle 44 is vaporized, the same effect can be attained, so long as the part of the liquid material in fine particle state reaches the vicinity of the substrate.

The material is supplied in a state of liquid fine particles before reaching the vicinity of the surface of the substrate. After the material has reached the vicinity of the surface of the substrate, the material is vaporized and decomposed. As a result, the concentration of the material becomes very high in the vicinity of the substrate, thereby increasing the deposition rate of the silicon film.

Figure 4:
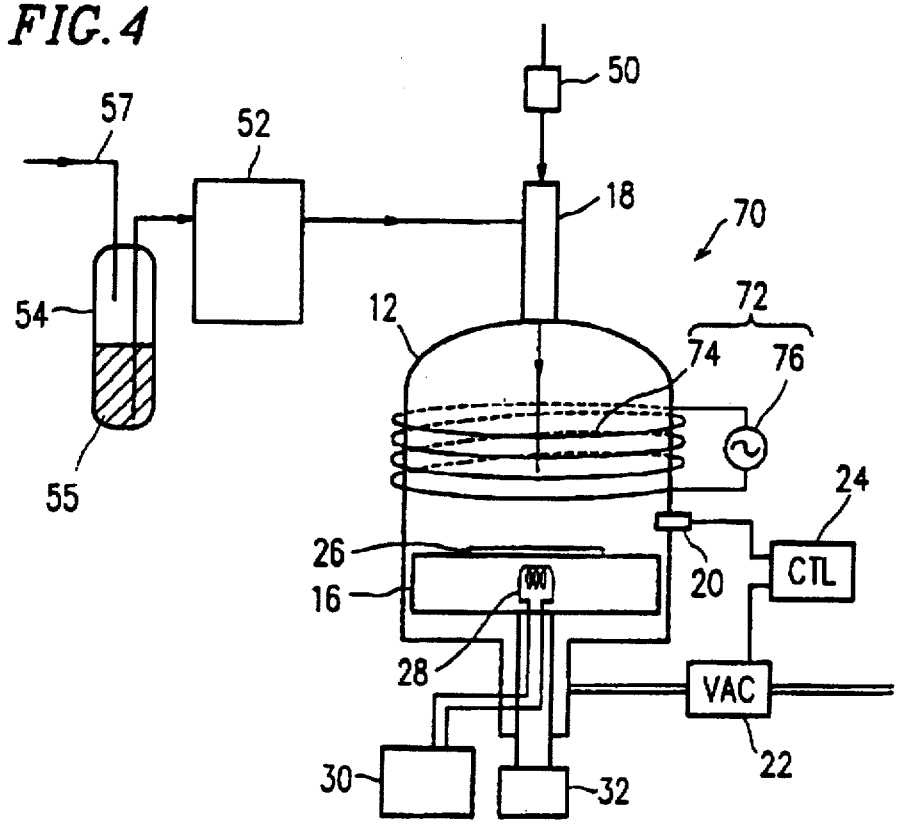
FIG. 4 is a view schematically showing another structure for the silicon film forming apparatus according to the first example of the invention.

In this example, the substrate is heated in order to decompose hexachlorodisilane in fine particle state which has reached the surface of the substrate. To further promote the decomposition, plasma discharge can also be used. A silicon film forming apparatus 70 shown in FIG. 4 is different from the silicon film forming apparatus 10 shown in FIG. 1 in that a plasma generator 72 is provided outside of a reaction chamber 12. The plasma generator 72 includes a coil 74 and an RF power supply 76 provided outside of the reaction chamber 12. An AC power in the range of 100 to 500 W is applied from the RF power supply 76 to the coil 74 at a frequency of 13.56 MHz, so that hexachlorodisilane sprayed in the reaction chamber 12 is decomposed to be in a plasma state. Therefore, even if the substrate 26 is heated at a low temperature, a silicon film can be formed at a high deposition rate. In order to generate the plasma discharge, the reaction chamber 12 is preferably pressurized in the range of about 1 m Torr to about 10 Torr.

EXAMPLE 2

Figure 5:
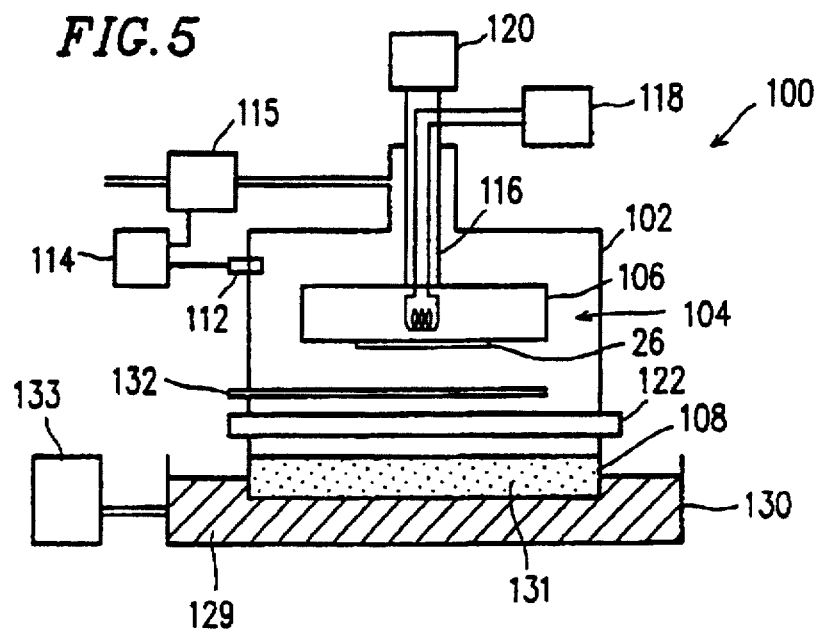
FIG. 5 is a view schematically showing a structure for a silicon film forming apparatus according to a second example of the invention.
Figure 6:
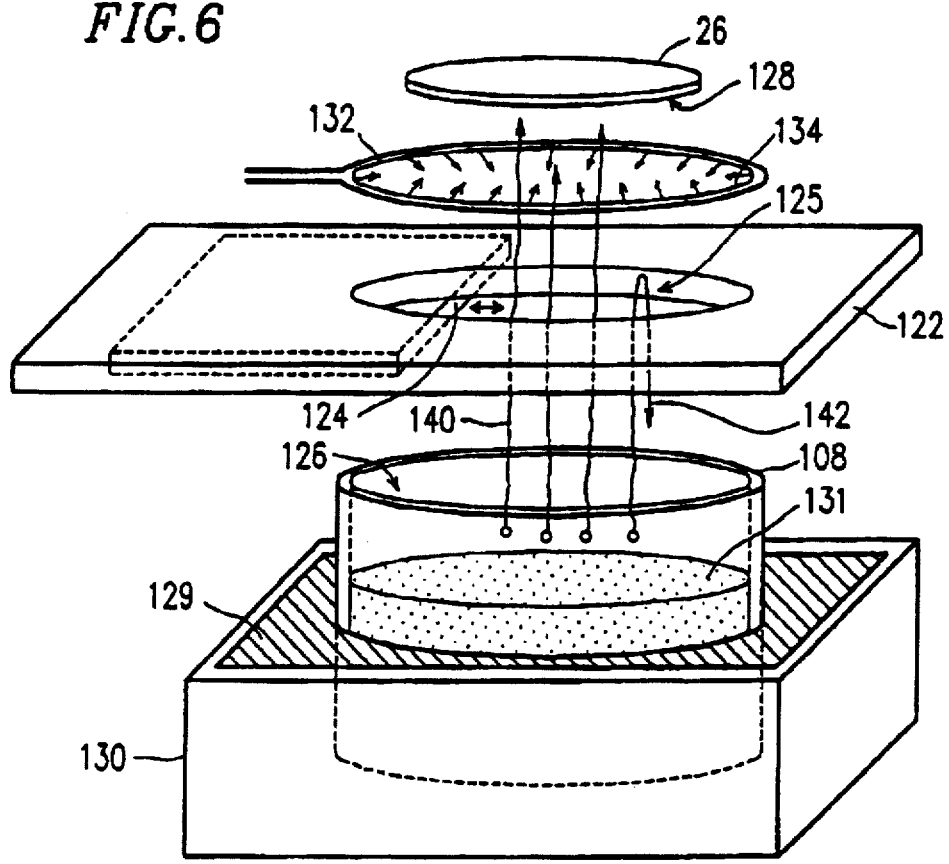
FIG. 6 is an exploded perspective view showing a main portion of the silicon film forming apparatus shown in FIG. 5.
Figure 7:
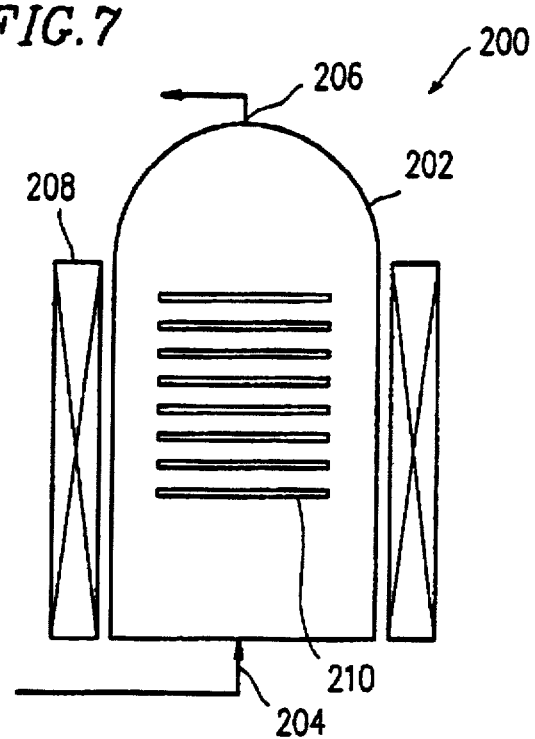
FIG. 7 is a view schematically showing a structure for a conventional silicon film forming apparatus.

FIG. 5 is a view schematically showing a structure for a silicon film forming apparatus 100 of Example 2 according to the present invention. FIG. 6 is an exploded perspective view showing the main portion of the silicon film forming apparatus 100. The silicon film forming apparatus 100 includes: a reaction chamber 102; a substrate holder 106 provided in a space 104 formed by the reaction chamber 102; and a material vessel 108.

The reaction chamber 102 is provided with a pressure gauge 112 so as to detect the pressure in the space 104. Based on the value detected by the pressure gauge 112, a vacuum controller 114 controls an exhaust pump 115 connected to the reaction chamber 102 so that the space 104 i s maintained at a constant pressure. Preferably, th e gas exhausted from the exhaust pump 115 is connected to a discharging tank (not shown), etc.

Preferably, the reaction chamber 102 is made of a material such as quartz or stainless steel, which is not corroded by a material gas, as described below. The reaction chamber 102 can have any size in accordance with the size of the silicon film to be formed therein. In the present example, the reaction chamber 102 made of quartz with a diameter of approximately 180 mm is used.

The substrate holder 106 is provided with a heater 116 for heating a substrate 26 supported on the surface of the substrate holder 106. The temperature of the substrate 26 is controlled by a temperature controller 118 connected to the heater 116. The substrate 20 holder 106 can be provided with a rotation controller 120 for rotating the substrate 26, in order to increase the uniformity of the silicon film to be formed thereon.

The reaction chamber 102 is separated from the material vessel 108 by a gate valve 122. When a shutter 124 of the gate valve 122 is opened, an port 126 of the material vessel 108 faces to a surface 128 of the substrate 26 supported by the substrate holder 106 via an port 125 of the gate valve 122. Preferably, the area of the port 126 of the material vessel 108 is larger than the area of the surface 128 of the substrate 26. For example, in the case where the diameter of the substrate 26 is 3 inches, it is preferable that the diameter of the material vessel 108 is approximately 4 inches.

The material vessel 108 is immersed in an ultrasonic vessel 130 filled with water or oil 129, and ultrasonic energy is supplied to hexachlorodisilane 131 contained in the material vessel 108. In the case where the diameter of the material vessel 108 is approximately 4 inches, the ultrasonic vessel 130 preferably has an ability of approximately 40 kHz, 600 W. In this case, it is preferable that the distance from the surface of hexachlorodisilane 131 to the substrate 26 is approximately in the range of about 10 to about 20 cm. In order that the water or oil 129 in the ultrasonic vessel 130 is maintained at a constant temperature, e.g., approximately 15° C., a cooler 133 is provided with the ultrasonic vessel 130.

Around a port 125 between the gate valve 122 and the substrate holder 106, a ring-shaped gas introducing tube 132 is provided. A plurality of holes 134 are provided around the inner periphery of the gas introducing tube 132, so that carrier gas or reaction gas is introduced into the reaction chamber 102 through the holes.

Hereinafter, a method for forming a silicon film by using the silicon film forming apparatus 100 will be described.

First, the substrate 26 made of quartz or silicon is supported on the substrate holder 106. The reaction chamber 102 is evacuated by using the exhaust pump 115 to produce a vacuum therein. Then, the substrate 26 is heated by the heater 116. In forming the silicon film, it is preferable to maintain the substrate 26 at a temperature in the range of about 450° to about 800° C. More preferably, the substrate 26 is maintained at approximately 700° C. The reaction chamber 102 is pressurized in the range of several tens of Torr to approximately 1 atmosphere of pressure.

Next, the ultrasonic vessel 130 is driven so as to supply an ultrasonic energy to hexachlorodisilane 131 in the material vessel 168. Then, the shutter 124 of the gate valve 122 is opened.

Hexachlorodisilane 131 in the material vessel 108 is vibrated by the ultrasonic energy, and hexachlorodisilane in a state of liquid fine particles is sprayed from the surface thereof onto the substrate 26 as shown by arrows 140. In this case, as described in Example 1, a portion of the hexachlorodisilane 131 sprayed from the material vessel 108 can be vaporized. The fine particles sprayed onto the substrate 26 usually have a size in the range of several μm to several tens of μm. However, the size of the particles is not limited to a specific value, and the particles can be of any size so long as the particles are in mist state.

Hexachlorodisilane in a fine particle state which has reached vicinity of the surface of the substrate 26 receives the radiated energy from the heated substrate 26. As a result, hexachlorodisilane is decomposed, so that silicon is deposited on the substrate 26. In this manner, a silicon film 60 is formed on the substrate 26. Hexachlorodisilane which has not reached the surface of the substrate 26 or has not contributed to the reaction returns to the material vessel 108 as shown by an arrow 142, and then receives the ultrasonic energy, so as to be sprayed from the material vessel 108 again.

The silicon film formed by this method is a polycrystalline film as well as that obtained in Example 1, and the quality thereof is suitable for a semiconductor apparatus such as a solar cell. As shown in Table 1, according to the method of this example, the deposition rate is approximately 5 times as fast as that obtained by a conventional CVD method using monosilane.

As is apparent from the foregoing description, according to the method of this example, hexachlorodisilane used as the material for the silicon film is sprayed upwards from the port. 126 of the material vessel 108 onto the substrate 26 in the reaction chamber 102. Hexachlorodisilane which has not been reacted returns to the material vessel 108, and then receives ultrasonic energy, so as to contribute to the reaction again. Therefore, an amount of the material which does not contribute to the reaction and is wastefully exhausted can be reduced, which results in a significant increase of the utilization efficiency of the material.

The material is supplied in a state of liquid fine particles before reaching the vicinity of the surface of the substrate. After the material has reached the vicinity of the surface of the substrate, the material is vaporized and decomposed. As a result, the concentration of the material becomes significantly high in the vicinity of the substrate, which results in an increase of the deposition rate of the silicon film.

Furthermore, hexachlorodisilane 131 in the material vessel 108 is sprayed by the ultrasonic energy, so that the fine particles are uniformly sprayed from the port 126 over a wide area. Since the area of the port 126 is larger than the area of the substrate 26, a silicon film having an uniform thickness can be formed on the entire surface of the substrate 26.

In this example, hexachlorodisilane is thermally decomposed. Alternatively, as described in Example 1, a plasma generator can be provided for the silicon film forming apparatus 100 so as to promote the decomposition by plasma discharge.

The same compound, carrier gas, and reaction gas as those described in Example 1 can be used as the material of the silicon film.

Instead of providing the gas introducing tube 132 between the gate valve 122 and the substrate holder 106, the gas introduction tube 132 can be immersed in hexachlorodisilane in the material vessel 108 so that hexachlorodisilane is bubbled. Alternatively, the gas introducing tube 132 can be dispensed with.

In Examples 1 and 2, hexachlorodisilane is decomposed by heating the substrate holder which supports the substrate. Alternatively, a heater is provided around the outer periphery of the reaction chamber, so that hexachlorodisilane is decomposed by the heat supplied therefrom.

Hexachlorodisilane has corrosiveness and generates chlorine or hydrogen chloride in the air. Accordingly, in consideration of safety, it is preferable that the silicon film is formed at 1 atmosphere of pressure or less. However, in the case of using a apparatus with a reaction chamber with a high leaktightness under an application of a pressure, a silicon film can be formed at 1 atmosphere of pressure or more. In such a case, the deposition rate is further increased.

According to the present invention, a silicon film can be deposited by using a material containing silicon or chlorine with a high utilization efficiency of the material and at a high rate. As a result, a silicon film can be formed at low cost. Moreover, a silicon film forming apparatus used in such a method can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a silicon film comprising the steps of
   introducing a compound containing silicon and chlorine and being in a liquid form under normal pressure and at an ordinary temperature into a reaction chamber, and spraying the compound in the liquid form in a fine particle state to a surface of a substrate supported in the reaction chamber, and
   decomposing the compound in the fine particle state by an energy applied from outside the reaction chamber, and depositing a silicon film on the substrate supported in the reaction chamber.

2. A method for forming a silicon film according to claim 1, wherein the step of spraying the compound includes a step of spraying the compound through a nozzle connected to the reaction chamber by using at least one of a carrier gas and a reaction gas.

3. A method for forming a silicon film according to claim 1, wherein the step of spraying the compound includes a step of vibrating the liquid compound supported so as to face to the substrate using ultrasonic waves, and spraying the compound from the surface of the liquid onto the substrate.

4. A method for forming a silicon film according to claim 3, wherein an area of the surface of the liquid is larger than an area of the surface of the substrate.

5. A method for forming a silicon film according to claim 3, wherein the step of spraying the compound includes a step of supplying the compound in the fine particle state to the substrate by introducing at least one of a carrier gas and a reaction gas.

6. A method for forming a silicon film according to claim 1, wherein the step of depositing the silicon film is conducted under a pressure in a range of several tens of Torr to about 1 atmosphere of pressure.

7. A method for forming a silicon film according to claim 1, wherein the substrate is heated by the energy, and the compound in the fine particle state is thermally decomposed by energy radiation from the substrate.

8. A method for forming a silicon film according to claim 1, wherein the compound in the fine particle state in the reaction chamber is decomposed into plasma by the energy.

9. A method for forming a silicon film according to claim 1, wherein the compound is hexachlorodisilane ($Si_2Cl_6$) or tetrachlorosilane ($SiCl_4$).

10. A method for forming a silicon film according to claim 1, wherein the compound is dichlorosilane ($SiH_2Cl_2$) or trichlorosilane ($SiHCl_3$).

11. A method for forming a silicon film according to claim 10, wherein the compound is liquefied by pressurization or cooling.

12. A method for forming a silicon film according to claim 2, wherein the reaction gas is hydrogen or carbon monoxide.

13. A method for forming a silicon film according to claim 5, wherein the reaction gas is hydrogen or carbon monoxide.

14. A method for forming a silicon film according to claim 2, wherein the carrier gas is argon or helium.

15. A method for forming a silicon film according to claim 5, wherein the carrier gas is argon or helium.

16. A silicon film forming apparatus comprising:
   a reaction chamber having a space;
   means for introducing a compound containing silicon and chlorine and being in a liquid form under a normal pressure and at an ordinary temperature into the reaction chamber, and spraying the compound in a liquid form in a fine particle state onto a surface of a substrate supported in the reaction chamber; and
   means for decomposing the compound in the fine particle state.

17. A silicon film forming apparatus according to claim 16, wherein the spraying means comprises a liquid sprayer having a liquid introducing port, a gas introducing port, and a nozzle connected to the reaction chamber, and
   the compound introduced from the liquid introducing port is sprayed from the nozzle to the reaction chamber by using at least one of a carrier gas and a reaction gas introduced from the gas introducing port.

18. A silicon film forming apparatus according to claim 16, wherein the spraying means is connected to the reaction chamber, and comprises: an port facing the surface of the substrate; a material vessel for storing the compound; and an ultrasonic generator for supplying ultrasonic energy to the material vessel.

19. A silicon film forming apparatus according to claim 18, wherein an area of the port of the material vessel is larger than that of the surface of the substrate.

20. A silicon film forming apparatus according to claim 19, wherein further comprises a gas introducing port for introducing at least one of the carrier gas and the reaction gas from a periphery of the port of the material vessel into the reaction chamber.

21. A silicon film forming apparatus according to claim 16, wherein the decomposition means comprises a heater for heating the substrate, and decomposes the compound in the fine particle state in a vicinity of the surface of the substrate by heating the substrate.

22. A silicon film forming apparatus according to claim 21, wherein the heating means comprises a substrate holder for supporting the substrate, and a heater provided for the substrate holder.

23. A silicon film forming apparatus according to claim 16, wherein the decomposition means comprises a ratio frequency power applicator provided around the reaction chamber, and decomposes the compound in the fine particle state in the reaction chamber into plasma by the ratio frequency power applicator.

* * * * *